United States Patent [19]
Valentine et al.

[11] Patent Number: 5,856,801
[45] Date of Patent: Jan. 5, 1999

[54] INPUT STAGE FOR A POLICE RADAR DETECTOR

[75] Inventors: Michael David Valentine; Clarence Richard Groth; Stephen Ray Scholl, all of Cincinnati, Ohio

[73] Assignee: Valentine Research, Inc., Cincinnati, Ohio

[21] Appl. No.: 929,355

[22] Filed: Sep. 12, 1997

[51] Int. Cl.$^6$ .................................................. G01S 7/40
[52] U.S. Cl. ........................... 342/20; 342/175; 455/334
[58] Field of Search ...................... 342/20, 175; 455/227, 455/334

[56] References Cited

U.S. PATENT DOCUMENTS

| | | | |
|---|---|---|---|
| 4,939,521 | 7/1990 | Burin | 342/20 |
| 4,952,936 | 8/1990 | Martinson | 342/20 |
| 5,068,663 | 11/1991 | Valentine et al. | 342/20 |
| 5,083,129 | 1/1992 | Valentine et al. | 342/20 |
| 5,116,248 | 5/1992 | Hiers et al. | 439/669 |
| 5,146,226 | 9/1992 | Valentine et al. | 342/20 |
| 5,151,701 | 9/1992 | Valentine et al. | 342/20 |
| 5,206,651 | 4/1993 | Valentine et al. | 342/20 |
| 5,250,951 | 10/1993 | Valentine et al. | 342/20 |
| 5,268,689 | 12/1993 | Ono et al. | 342/20 |
| 5,300,932 | 4/1994 | Valentine et al. | 342/20 |
| 5,305,007 | 4/1994 | Orr et al. | 342/20 |
| 5,315,302 | 5/1994 | Katsukura et al. | 342/20 |
| 5,446,923 | 8/1995 | Martinson et al. | 455/330 |

*Primary Examiner*—John B. Sotomayor
*Attorney, Agent, or Firm*—Killworth, Gottman, Hagan & Schaeff, L.L.P.

[57] ABSTRACT

An input stage of a police radar detector is configured so that a near end of a mixer is coupled to an antenna for receiving high frequency signals and a far end of the mixer is coupled to the antenna for receiving low frequency signals. A local oscillator and an intermediate frequency amplifier are also coupled to the far end of the mixer. The low frequency signals, X band police radar signals, are coupled to the far end of the mixer through a band rejection filter, which serves as a diplexer, a preamplifier and a first bandpass filter. The local oscillator is coupled to the far end of the mixer through a second bandpass filter and the far end of the mixer is coupled to the intermediate frequency amplifier through a low pass filter. The high frequency signals, K band and $K_a$ band signals, are coupled to the near end of the mixer from the antenna through a high pass filter. The diplexer in combination with the first and second bandpass filters, the low pass filter and the high pass filter passively multiplex the related signals within the input stage of the police radar detector.

20 Claims, 5 Drawing Sheets

INPUT STAGE FOR A POLICE RADAR DETECTOR

CROSS-REFERENCE TO RELATED APPLICATIONS

This application is related to the listed applications which have common inventors, are assigned to the same assignee as the present application, were filed on even date herewith and are entitled: POLICE RADAR DETECTOR FOR SWEEPING K AND $K_a$ RADAR BANDS DURING ONE LOCAL LOCAL OSCILLATOR SWEEP (Ser. No. 08/928,565); POLICE RADAR DETECTOR INCLUDING NUISANCE ALERT SUPPRESSION (Ser. No. 08/928,780); and, INPUT STAGE FOR POLICE RADAR DETECTOR INCLUDING INPUT SIGNAL PREAMPLIFICATION (Ser. No. 08/928,960). These cross-referenced applications are incorporated herein by reference.

BACKGROUND OF THE INVENTION

The present invention relates in general to police radar detectors and, more particularly, to a novel input stage for a police radar detector which input stage efficiently interconnects an antenna, a local oscillator, a mixer and an intermediate frequency amplifier within the input stage.

Police have used radar waves to monitor the speed of motor vehicles for many years. The frequencies currently licensed in the United States for police radar waves include: the X band—10.50 gigahertz (Ghz) to 10.55 Ghz; the K band—24.05 Ghz to 24.25 Ghz; and, the $K_a$ band—33.40 Ghz to 36.00 Ghz. To alert motorists of the presence of police radar, electromagnetic signals within these police radar bands are monitored using a police radar detector which issues an audible and/or visual alert upon detection of a radar signal within one of bands.

Police radar detectors are basically superheterodyne radio receivers in which the tuning of the receivers is repeatedly swept through the frequencies which are to be received or detected, i.e., the frequencies of the licensed police radar bands. A typical superheterodyne radio receiver includes a mixer for receiving electromagnetic signals and a local oscillator (LO) signal to convert the frequency of the received signals to the frequency of an intermediate (IF) amplifier with the LO being swept in frequency to tune the required frequencies. Incoming electromagnetic signals can then be received at the LO frequency plus or minus the IF frequency.

It is important to process received electromagnetic energy as efficiently as possible within a police radar detector so that weak radar signals can be effectively detected. An operator of the detector can then be alerted of the presence of police radar signals at the earliest possible time giving the operator sufficient advance notice that the operator can verify that he or she is operating their vehicle at an appropriate speed. To this end, input stages for police radar detectors must efficiently interconnect an antenna, the LO, the mixer and the IF amplifier so that there is minimal loss of each signal from the signal's source to its destination.

In the interest of advancing the art and to provide improved performance for police radar detectors, there is an ongoing need for novel and improved arrangements for input stages for police radar detectors.

SUMMARY OF THE INVENTION

This need is currently met by the invention of the present application wherein an input stage of a police radar detector is configured so that a near end of a mixer is coupled to an antenna for receiving high frequency signals and a far end of the mixer is coupled to the antenna for receiving low frequency signals. A local oscillator and an intermediate frequency amplifier are also coupled to the far end of the mixer. The low frequency signals, X band police radar signals, are coupled to the far end of the mixer through a band rejection filter, which serves as a diplexer, a preamplifier and a first bandpass filter. The local oscillator is coupled to the far end of the mixer through a second or local oscillator bandpass filter and the far end of the mixer is coupled to the intermediate frequency amplifier through a low pass filter. The high frequency signals, K band and $K_a$ band signals, are coupled to the near end of the mixer from the antenna through a high pass filter. The diplexer in combination with the first and second bandpass filters, the low pass filter and the high pass filter passively multiplex the related signals within the input stage of the police radar detector.

In the input stage topology of the present application, including the connection of the X band preamplifier to the far end of the mixer, the mixer provides additional attenuation of any signals which may feedback toward the input of the X band preamplifier which is coupled to the near end of the mixer. Attenuation of these feedback signals reduces the possibility of oscillation of the X band preamplifier. The input stage topology also provides a very direct and low loss path for K band and $K_a$ band signals from the antenna to the near end of the mixer which is believed to result in a favorable noise figure on the K band. More conventional input stage connections recombine preamplified X band signals with a passive K and $K_a$ band path and apply the recombined signals to a single terminal of the mixer. Such input stages or networks are believed to have higher insertion loss on the K and $K_a$ bands which leads to a commensurate increase in noise figure.

It is, thus, an object of the present invention to provide a novel input stage for a police radar detector which input stage efficiently interconnects an antenna, a local oscillator, a mixer and an intermediate frequency amplifier within the input stage.

Other objects and advantages of the invention will be apparent from the following description, the accompanying drawings and the appended claims.

DETAILED DESCRIPTION OF THE INVENTION

Figure 1:
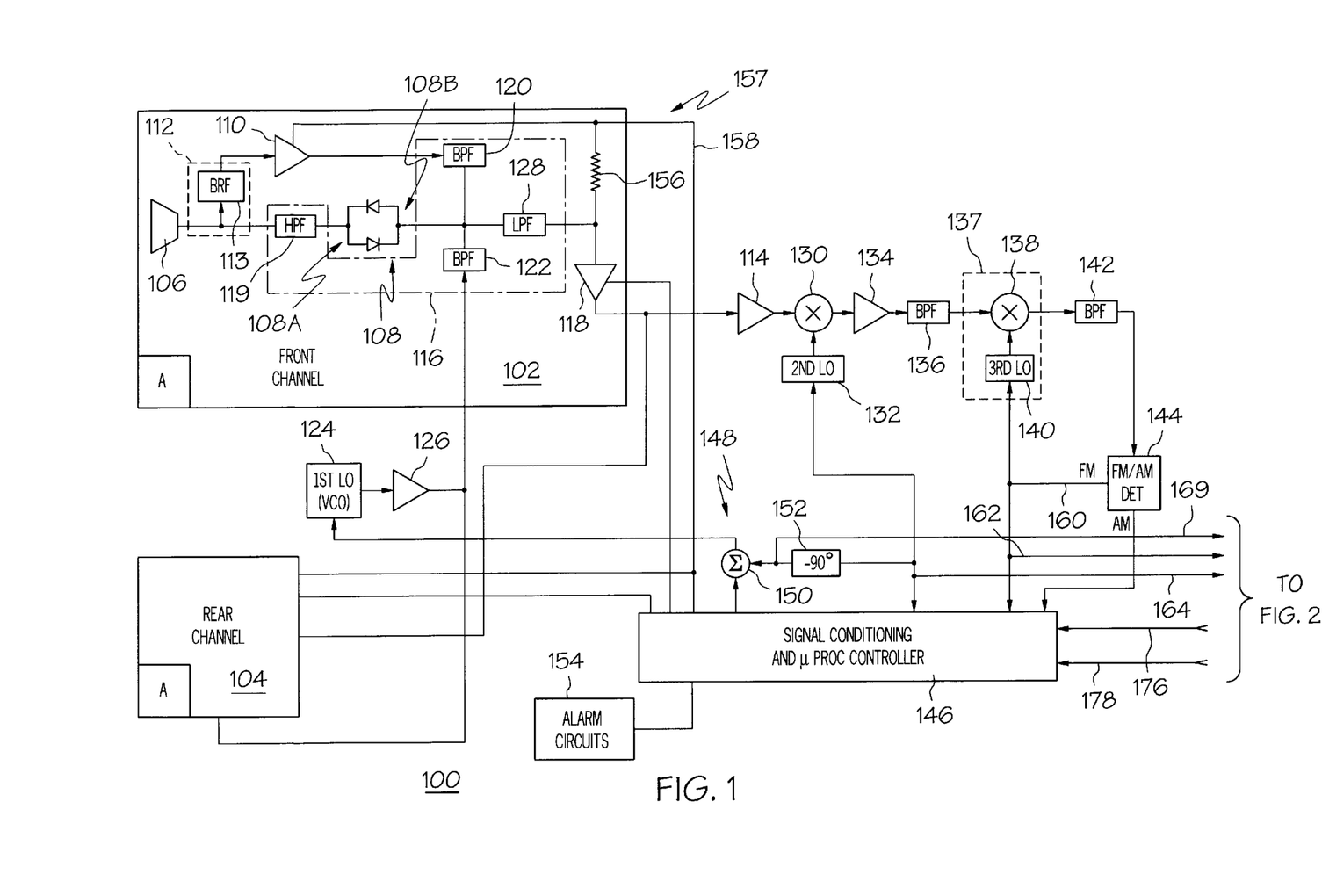
FIG. 1 is a schematic block diagram of a police radar detector for practicing the invention of the present application.

Reference will now be made to FIG. 1 which illustrates, in schematic block diagram form, a police radar detector 100 utilizing heterodyne receiver principles and being suitable for practicing the invention of the present application. The police radar detector 100 includes two input stages 102, 104 which are substantially the same so that only the input stage 102 will be described herein. The input stages 102, 104 correspond to a front channel and a rear channel, respectively. Operation of the radar detector 100 using the two input stages 102, 104, or the front and rear channels, is for detecting police radar signals and determining the directional origin of the signals as taught in U.S. Pat. No. 5,083,129 which is assigned to the same assignee as the present application and is incorporated herein by reference.

The input stage 102 includes an antenna 106, such as a microwave horn, for receiving incoming electromagnetic signals. The antenna 106 is coupled to a first mixer 108 and preamplification circuitry comprising an X band preamplifier 110 by a diplexer 112. In the illustrated embodiment of the police radar detector 100, the diplexer 112 comprises a K band and $K_a$ band rejection filter 113 which rejects frequencies in a band extending from approximately 24 gigahertz (Ghz) to approximately 36 Ghz. The first mixer 108 as illustrated comprises a pair of antiparallel diodes having a near side 108A coupled to the antenna 106 by the diplexer 112 and the preamplifier 110, and a far side 108B coupled to a first intermediate frequency (IF) amplifier 114 through a novel passive multiplexer 116 and a first IF preamplifier 118. The first IF preamplifier 118 and first IF amplifier 114 are centered around 5 Ghz.

The passive multiplexer 116 comprises: a high pass filter 119 coupled between the antenna 106 and the first mixer 108 for passing signals in the police radar K band, i.e., from approximately 24.05 Ghz to approximately 24.25 Ghz, and the police $K_a$ band, i.e., from approximately 33.40 Ghz to approximately 36.00 Ghz, to the near side 108A of the first mixer 108; a first bandpass filter 120 which is designed to pass frequencies in the police radar X band, i.e., from approximately 10.50 Ghz to approximately 10.55 Ghz, to the far side 108B of the mixer 108; and, a local oscillator or second bandpass filter 122 which is designed to pass first local oscillator (LO) signals to the far side 108B of the first mixer 108.

The first LO signals are generated by a first local oscillator (LO) 124 and amplified by an amplifier 126. In the illustrated embodiment, the first LO 124 comprises a voltage controlled oscillator (VCO) and generates signals which sweep in frequency from approximately 15.149 Ghz to approximately 15.079 Ghz for sweeping the X band and from approximately 15.149 Ghz to approximately 14.310 Ghz for simultaneously sweeping the K band and the $K_a$ band. The high pass filter 119 substantially prevents LO signals from being passed to and broadcast from the antenna 106 by serving as a short to ground for the LO signals so that the LO drive is delivered substantially to the mixer diodes with relatively little LO power being delivered to the antenna 106. The passive multiplexer 116 also comprises a low pass filter 128 which is designed to pass frequencies from direct current (dc) to approximately 6 Ghz. The band reject filter 113, which forms the diplexer 112, can also be considered as forming part of the passive multiplexer 116 since the passive multiplexer 116 must perform the functions of interconnecting the antenna 106, the first LO 124, the first mixer 108 and the first IF amplifier 114 with minimal loss from each source of signals to its respective destination.

In the input stage topology, illustrated by the input stage 102, including the connection of the X band preamplifier 110 to the far end 108B of the mixer 108, the mixer 108 provides additional attenuation of any signals which may feedback toward the input of the X band preamplifier 110. Attenuation of these feedback signals reduces the possibility of oscillation of the X band preamplifier 110. The input stage topology all provides a very direct and low loss path for K band and $K_a$ band signals from the antenna 106 to the near end 108A of the mixer 108 which is believed to result in a favorable noise figure on the K and $K_a$ band. More conventional input stage connections recombine preamplified X band signals with a passive K band and $K_a$ band path and apply the recombined signals to a single terminal of the mixer. Such input stages or networks are believed to have higher insertion loss on the K and $K_a$ bands which leads to a commensurate increase in noise figure.

Signals from the first IF amplifier 114 are passed to a second mixer 130 which can be a pair of antiparallel diodes or other appropriate known mixer circuit. The second mixer 130 also receives second LO signals generated by a second LO 132 having a frequency of approximately 5.2 Ghz in the illustrated embodiment. Signals from the second mixer 130 are passed to a second IF amplifier 134 and a bandpass filter 136 both having a frequency of around 600 megahertz (Mhz), preferably around 611 Mhz. The bandpass filter 136 is connected to a single sideband down converter 137 comprising a third mixer 138 and a third LO 140 operating at 611.3 Mhz to down convert signals to approximately 300 kilohertz (Khz). The single sideband down conversion avoids degradation of the system noise figure by approximately 3 dB. The circuitry beyond the second LO 132 forms detector circuitry for detecting electromagnetic signals in the police radar bands.

A 300 Khz bandpass filter 142 passes signals from the down converter 137 to an amplitude detector and frequency modulation (FM) detector circuit 144, sometimes referred to as a discriminator or demodulator circuit, which operates in a manner disclosed in U.S. Pat. No. 5,068,663 which is assigned to the same assignee as the present application and is incorporated herein by reference. The FM output or frequency demodulation detection signal from the circuit 144 is passed to the third LO 140 to lock the radar detector 100 onto incoming electromagnetic signals and also to signal conditioning and control circuitry 146 which includes a processor, preferably any one of a number of appropriate microprocessors.

Modulation circuitry 148, comprising a summer 150 and a 90° phase shifter circuit 152, coupled between the signal conditioning and control circuitry 146 and the first and second LO's 124, 132 connect a first modulation signal to the first local oscillator 124 and a second modulation signal, directly generated by the signal conditioning and control circuitry 146, to the second local oscillator 132. Upon detecting a valid police radar signal, the signal conditioning and control circuitry 146 activate alarm circuits 154 which can be audible, visual including numeric, directional arrows, or other appropriate for a given alerting arrangement in a known manner.

With the understanding of the radar detector 100 gained from the above overview, various aspects of the radar detector 100 will now be described in more detail. The frequencies that must be scanned to cover the police radar bands licensed in the United States are: the X band—10.50 Ghz to 10.55 Ghz; the K band—24.05 Ghz to 24.25 Ghz; and, the $K_a$ band—33.40 Ghz to 36.00 Ghz. The frequency scheme of the radar detector 100, i.e., the frequencies used within a police radar detector including frequencies or swept frequency bands of local oscillators and frequencies of intermediate amplifiers, provides for sweeping first and second police radar bands, the K band and the $K_a$ band, during a single sweep of the first LO signal generated by the first LO 124 under the control of the signal conditioning and control circuitry 146.

In particular, the 611 MHz second IF amplifier 134 in conjunction with the 5.2 Ghz second LO 132 lead to potential reception of signals at 5.811 Ghz and 4.589 Ghz, i.e., 5.2 Ghz±611 Mhz, in the first IF amplifier 114 and the first IF preamplifier 118. Rather than suppressing one of these responses as undesired, which is commonly done, the radar detector 100 retains both responses at roughly comparable sensitivities to simplify coverage of the police radar bands. These two IF responses, 5.811 Ghz and 4.589 Ghz, combine with the first LO signals from the first LO 124 to yield a total of four receive frequencies, i.e., first LO±5.811 Ghz and first LO±4.589 Ghz.

Reference should now be made to Table 1 which details the frequencies adopted in the illustrated embodiment of the radar detector 100. Each row in Table 1 is labeled with a filter 128, i.e., to the far side of the first mixer 108. The dc bias upsets the balance of the diodes which make up the first mixer 108 so that one of the diodes is forward biased and the other diode is reversed bias. This dc bias causes the first mixer 108 to mix more efficiently with the fundamental of the applied first LO signals rather than the second harmonic of the signals generated by the first LO 124. In addition, the tuning range of the VCO making up the first LO 124 is reduced to a fraction of the range employed in the K/$K_a$ operating mode. The dc bias also enables the X band preamplifier 110 which is disabled during the K/$K_a$ operating mode. The changed operating mode for X band reception is indicated in rows 5–8 of Table 1. Note that once

TABLE 1

Receiver frequency Scheme

| Ref. | Fvco | F1 | Frf Function | Frf | Coverage | IF Function |
| --- | --- | --- | --- | --- | --- | --- |
| 1) | 15.149 -> 14.310 | 30.298 -> 28.620 | Frf = F1 + F2 + F3 | 36.109 -> 34.431 | Top of Ka | F3 = Frf - F1 - F2 |
| 2) | 15.149 -> 14.310 | 30.298 -> 28.620 | Frf = F1 + F2 - F3 | 35.487 -> 33.209 | Bottom of Ka | F3 = Frf + F1 + F2 |
| 3) | 15.149 -> 14.310 | 30.298 -> 28.620 | Frf = F1 - F2 + F3 | 25.709 -> 24.031 | K | F3 = Frf - F1 + F2 |
| 4) | 15.149 -> 14.310 | 30.298 -> 28.620 | Frf = F1 - F2 - F3 | 24.487 -> 22.809 | Interference & K | F3 = Frf + F1 - F2 |
| 5) | 15.149 -> 15.079 | 15.149 -> 15.079 | Frf = F1 + F2 + F3 | 20.960 -> 20.890 | Of no interest | F3 = Frf - F1 - F2 |
| 6) | 15.149 -> 15.079 | 15.149 -> 15.079 | Frf = F1 + F2 - F3 | 19.738 -> 19.668 | Of no interest | F3 = Frf + F1 + F2 |
| 7) | 15.149 -> 15.079 | 15.149 -> 15.079 | Frf = F1 - F2 + F3 | 10.560 -> 10.490 | X | F3 = Frf - F1 + F2 |
| 8) | 15.149 -> 15.079 | 15.149 -> 15.079 | Frf = F1 - F2 - F3 | 9.338 -> 9.268 | Of no interest | F3 = Frf + F1 - F2 |

F1 is the first mixer local oscillator injection and is 2*Fvco in Responses 1–4; F1 = Fvco in responses 5–8.
F2 is the second mixer local oscillator frequency (5.2 Ghz).
F3 is the second intermediate amplifier frequency (611 Mhz).

reference number, i.e., rows 1–8, in the first column. In rows 1–4, the first LO 124 signal (Fvco) is swept from approximately 15.149 Ghz to approximately 14.310 Ghz as shown in the second column of Table 1. In the fundamental operating mode of the first mixer 108, the local oscillator frequency is inherently doubled to yield injection of first local oscillator signals (F1) having frequencies which are swept from 30.298 Ghz to 28.620 Ghz as shown in column three. The frequency doubling is due to the antiparallel diodes of the first mixer 108 conducting on alternate half-cycles of the LO signal from the first LO 124 in the fundamental operating mode.

The fourth column in each row shows the four different functions or equations which describe frequency conversion from the frequency of received electromagnetic signals (Frf) to the output (F3) of the second IF amplifier 134 at approximately 611 Mhz. The fifth column lists the corresponding frequency ranges of incoming electromagnetic signals Frf that are searched as the first LO 124 is swept across its tuning bandwidth. The sixth or Coverage column of Table 1 shows the particular police radar bands or portions of bands which are covered by the receiver responses. In the last column of Table 1, the frequency equations of the third column of Table 1 are solved for the second IF amplifier 134 output, F3. These relationships are repeated for convenience in Table 2 which will be referred to later herein.

To provide coverage of the X band, the operating mode of the first mixer 108 is switched between the K/$K_a$ band operating mode and the X band operating mode by band switching circuitry 157 comprising a resistor 156 and a conductor 158 which extends between the signal conditioning and control circuitry 146 and the X band preamplifier 110. The signal conditioning and control circuitry 146 is thereby able to apply a direct current (dc) bias to the diodes which make up the first mixer 108 through -the low pass again four responses are generated. In the X-band mode of operation, only the response of row 7 provides a signal of interest. Accordingly, to reduce noise within the radar detector 100, the X band preamplifier 110 may be designed to suppress unwanted responses.

The frequency scheme of the police radar detector 100 as described and illustrated in Table 1 is advantageous in that the responses of rows 1–4 each deliver signals of interest over at least a portion of their respective tuning ranges. This approach enjoys better noise figure relative to existing designs that employ second harmonic mixing for the K band and third harmonic mixing for the $K_a$ band. Using the first IF responses in the 5 Ghz range allows the K and $K_a$ bands to be swept simultaneously, i.e., during a single sweep of the first LO 124. For example, a 5.0 Ghz IF yields two receiver responses 10 Ghz apart, allowing 24.0 Ghz and 34.0 Ghz to be tuned simultaneously. By extension, using two responses, e.g., at 4.589 Ghz and 5.811 Ghz, allows the $K_a$ band to be covered with reduced vco tuning bandwidth. It is noted that in the process of covering the 2.6 Ghz wide $K_a$ band, the receiver also scans other frequencies that must ultimately be ignored. The ability to ignore these unwanted signals is performed by a combination of frequency calibration of the first LO 124, i.e., the point in the sweep at which a signal is detected is monitored as disclosed in referenced U.S. Pat. No. 5,068,663; and, by being able to identify the active mixer sidebands as will now be described.

An important feature of most radar detectors is the ability not only to generate a warning or alert when a radar signal is received, but also to identify the radar band in which the signal originates. When a signal is received in the radar detector 100, the frequency of the first LO 124 is known because of calibration of the first LO 124, i.e., the point in the sweep of the first LO 124 at which a signal is detected is noted by the signal conditioning and control circuitry 146 as described above. However, four frequency conversion paths are active simultaneously in the police radar detector 100 so it is not immediately apparent which receiver response is producing the signal. This four level ambiguity in the received frequency must be resolved in order to uniquely identify the origin of an incoming signal.

The circuit 144 includes an FM detector which generates a frequency demodulation detection signal as its output. If a modulation signal, such as a 500 hertz sine wave, is applied for example to the second LO 132, the modulation will be superimposed upon the received signal and will appear at the FM detector output 160. The detected modulation will be either in phase or 180° out of phase with the applied modulation, depending on whether the signal path was the upper sideband or the lower sideband of the second mixer. Analogous results occur if modulation is applied to the first LO 124. Thus, if a modulation signal, such as a 500 hertz sine wave, is applied to the first LO 124, the modulation will be superimposed upon the received signal and will appear at the FM detector output 160. Again, the detected modulation will be either in phase or 180° out of phase with the applied modulation, depending on whether the signal path was the upper sideband or the lower sideband of the first mixer. These operations are illustrated in Table 2 which shows the frequency conversion equations of the fourth column of Table 1 solved for the IF output frequency, F3, at 611 Mhz.

TABLE 2

| | | FM Detection Phase | |
|---|---|---|---|
| Ref. | IF Function | Slope F3/F1 | F3/F2 |
| 1) | F3 = Frf − F1 − F2 | −1 | −1 |
| 2) | F3 = Frf + F1 + F2 | +1 | +1 |
| 3) | F3 = Frf − F1 + F2 | −1 | +1 |
| 4) | F3 = −Frf + F1 − F2 | +1 | −1 |
| 5) | F3 = Frf − F1 − F2 | −1 | −1 |
| 6) | F3 = Frf + F1 + F2 | +1 | +1 |
| 7) | F3 = Frf − F1 + F2 | −1 | +1 |
| 8) | F3 = −Frf + F1 − F2 | +1 | −1 |

Examining the response of row 3, for example, if frequency modulation is applied to the first LO 124, increasing F1 produces decreasing F3. The detected frequency modulation would thus be 180° out of phase with the applied modulation. Conversely, modulating the second LO 132 upward in frequency would generate increasing F3. Thus, detected FM would be in phase with modulation applied to F2. Stated differently, the partial derivatives or slopes of F3 with respect to F1 and F2 are −1 and +1, respectively. These slopes for the four receiver responses are tabulated in Table 2. Inspection reveals four different combinations that in 2-bit binary fashion determine the active signal path.

When a signal is acquired, the signal conditioning and control circuitry 146 of the radar detector 100 performs these operations to identify the active frequency conversion function. Measurement is accomplished in an economical manner by employing orthogonal modulation at the two local oscillators that is analogous to quadrature phase shift keying (QPSK) used in data communication. Synchronous quadrature correlation of the detected frequency modulation yields either positive or negative correlation with each local oscillator. The correlations correspond directly to the aforementioned slopes, thus resolving the frequency ambiguity. It is therefor apparent that −1, −1 and +1, +1 identify a detected incoming signal as being in the $K_a$ band while −1, +1 and +1, −1 identify a detected incoming signal as being in the K band. When detecting X band, −1, +1 identify a detected incoming signal as being in the X band.

Figure 5:
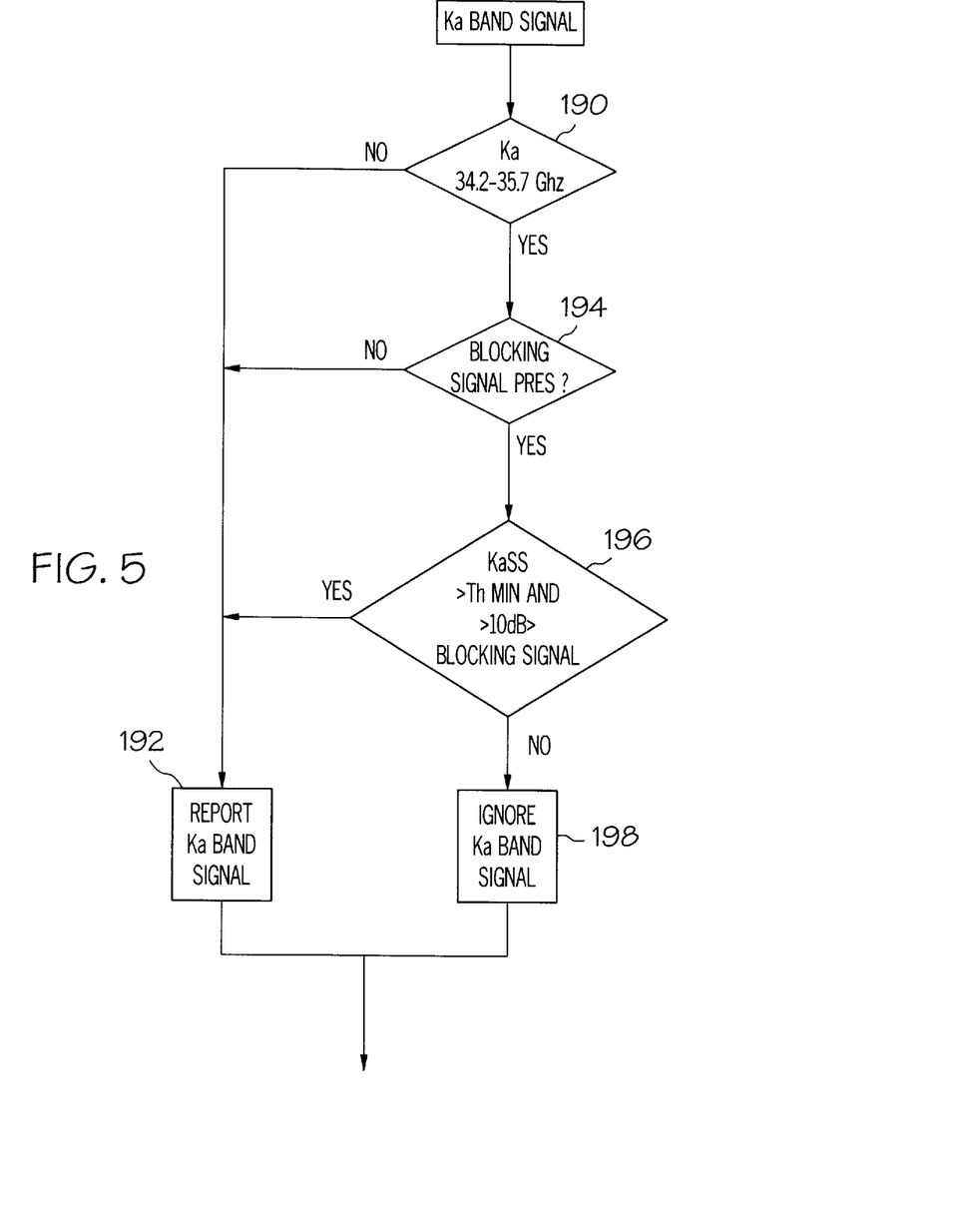
FIG. 5 is a flow chart for processing $K_a$ band signals to determine whether they are likely produced by a nearby radar detector and should therefor be suppressed.

A hardware implementation of quadrature correlation is conceptually illustrated in the schematic block diagram of FIG. 5. The signal conditioning and control circuitry 146 of the police radar detector 100 generates a 500 Hz sine wave which is passed through the modulation circuitry 148 to result in a first modulation signal being applied to the first LO 124 with the 500 Hz signal serving as a second modulation signal which is applied to the second LO 132. Thus, the first and second modulation signals are in quadrature to one another.

Figure 2:
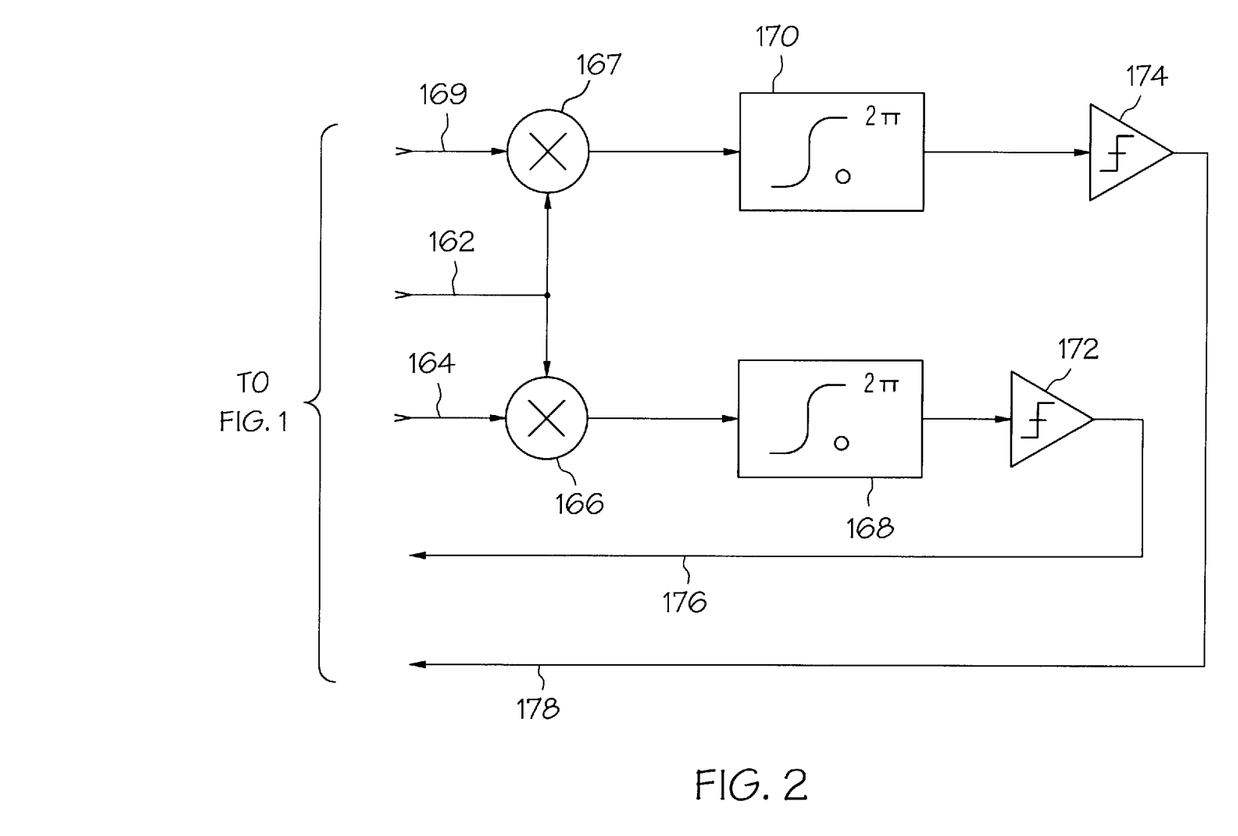
FIG. 2 is a schematic block diagram illustrating quadrature correlation for the resolution of frequency ambiguities in the police radar detector of FIG. 1.

Correlated detection is performed by multiplying or mixing the detected FM signal on a conductor 162 with the 500 Hz signal generated by the signal conditioning and control circuitry 146 on a conductor 164 in a mixer circuit 166 and integrating the result over one or more integer periods of the modulation in a first integrator circuit 168; and, mixing the detected FM signal on the conductor 162 in a mixer 167 with the 500 Hz signal which has been shifted by −90° on the conductor 169 and integrating the result over one or more integer periods of modulation in a second integrator circuit 170. The output signals from the integrator circuits 168 and 170 are passed through threshold circuits 172, 174, respectively, to generate the +1 or −1 slopes which are sent to the signal conditioning and control circuitry 146 on conductors 176, 178 where the operations described above are performed to determine the radar bands of received electromagnetic signals.

It is well known from modem theory that the quadrature modulation arrangement allows two independent data bits to be transmitted simultaneously. In analogous fashion, the quadrature modulation arrangement permits characterization of both frequency conversions simultaneously and operates with an economy of hardware and signal analysis time. While a hardware implementation is shown in FIG. 2, the synchronous quadrature correlation for the radar detector 100 is preferably implemented by digitizing the detected FM signal and performing the multiplications and integrations numerically in software within a microprocessor of the signal conditioning and control circuitry 146.

The quadrature correlation technique is very economical since the 90° phase shifter circuit 152 can be constructed in a conventional manner using only one capacitor and a few resistors and the quadrature detection requires only additional software for performing operations corresponding to the operations performed by the hardware of FIG. 2. While the above described modulation/quadrature correlation techniques are preferred for the radar detector 100, it is apparent that other modulation techniques can also be utilized. For example, modulation signals having different frequencies can be applied to one or both mixers.

By using the above described techniques, the frequency of any signal detected by the radar detector 100 can be uniquely identified. A review of rows 1–4 of Table 1 shows that some portions of the K band, from 24.031 Ghz to 24.487 Ghz, and some portions of the $K_a$ band, from 34.431 Ghz to 35.487 Ghz are scanned twice because of overlapping frequency coverage. Accordingly, indiscriminate counting of valid K and $K_a$ band responses would lead to some double counting of signals lying within the overlapping regions. To overcome these counting problems, the radar detector 100 is characterized during manufacturing to determine the A/D codes of the sweep signals corresponding to 34.431 Ghz in row 2 and 35.487 Ghz in row 1. The measured codes are stored so that they can be used in connection with band identification to avoid double counting of signals within the overlapping regions. Double counting of K band signals is precluded by simply ignoring K band signals received in the responses of row 4 of Table 1. This signal identification permits determination of the accurate number of radar sources incident on the radar detector 100 so that the user of the radar detector 100 can be notified. Detection and alerting of multiple radar sources is described in U.S. Pat. No. 5,146,226 which is assigned to the same assignee as the present application and is incorporated herein by reference.

Signal processing is also performed to ensure proper signal counting as well as to provide better operation of the radar detector 100. As noted above, single sideband (SSB) suppression is employed in the third mixer 138 of the single sideband down converter 137 to avoid degradation of the system noise figure by approximately 3 dB. The 611 Mhz SSB down converter improves noise figure by suppressing image noise in the undesired response or sideband. Modest amounts of suppression are required to attain most of the available 3 dB improvement, for example 10 dB image suppression achieves a 2.6 dB improvement. However, it is impractical to achieve perfect rejection and insufficient suppression of the undesired sideband can result in inaccurate signal strength assessment and an accurate determination of the number of radar sources which are incident on the radar detector 100 at any given time. A strong signal appearing in the desired sideband would of course be counted, but this same strong signal leaking through an imperfectly suppressed sideband must not be counted as an additional signal.

The possible double counting is ameliorated by employing a final IF of only 300 Khz. The image response is then only 600 Khz away, about at the quantization resolution of the analog-to-digital (A/D) used for input to the microprocessor of the signal conditioning and control circuitry 146, and no attempt is made to attain such fine resolution within the nearly 3 Ghz of scanned spectrum. In addition, once a signal has been acquired and characterized by the radar detector 100, the sweep voltage of the VCO forming the first oscillator 124 of the illustrated embodiment is controlled to skip the sweep voltage by a few megahertz before sweeping is continues so that the same signal cannot be acquired. Thus, an image only a few hundred kilohertz away would be skipped over and not counted thus avoiding and double counting.

However, a false lock can occur if a sufficiently strong signal is swept downward in frequency. Such a strong signal will enter the final IF via an incompletely suppressed upper sideband and it is probable that the radar detector will lock to the signal. Under these circumstances, the sense of the FM feedback loop is effectively reversed and when FM feedback equilibrium is achieved, the signal lies on the skirt of the IF rather than at or near its center. The result is that the very strong signal will be misrepresented as a weak signal. And, the correct strong response will be skipped over as described above so correct assessment of signal strength is blocked.

To overcome this problem, the radar detector 100 system must be controlled to ensure that it reliably locks to the received signal. How this is accomplished in the radar detector 100 will now be described. After the detector has parked on a signal and characterized the signal strength of the signal, the SSB suppression is disabled so that the third mixer 138 operates as a dual conversion mixer, i.e., with equal sensitivity on the upper and lower sidebands. At the same time, a unity gain inverter is inserted into the FM feedback loop and signal strength is remeasured. One of two possibilities arises. If the signal was previously detected in the desired sideband, the FM feedback will now be in the wrong sense and the signal will move to the IF or filter skirt resulting in a low signal strength or even complete loss of signal. On the other hand, if the signal was previously detected in the suppressed or undesired sideband, the FM feedback will now be in the correct sense and the sideband will move to the center of the IF or filter. Further, the sideband is no longer rejected and the signal path gain will rise with both mechanisms contributing to dramatically improved signal strength. The higher of the two signal strength measurements is the valid characterization with a 6 dB correction being made to the raw measurement because the double sideband conversion turns out to have a 6 dB lower gain than SSB operation.

An important aspect of the radar detector 100 is its ability to suppress nuisance alerts due to incoming signals other than police radar and, in particular, incoming signals which are generated by other radar detectors. Due to the unique frequency scheme used for the radar detector 100, nuisance alerts due to the third harmonic (34.65 Ghz) of leakage from other radar detectors around 11.55 Ghz, which is a commonly used LO frequency in many radar detectors currently in use, can be readily processed.

A review of Table 1 shows that the frequencies of received electromagnetic signals (Frf) which are scanned by the first LO 124 during each simultaneous sweep of the K band and the $K_a$ band include 22.809 Ghz through 24.487 Ghz, see row 4 of Table 1. This frequency range is referred to as Interference & K band signals and includes signals around 23.1 Ghz, which is the second harmonic of a LO operating around 11.55 Ghz. While signals around 23.1 Ghz would normally be considered to be interference, in the radar detector 100, these signals are detected during normal scanning operations so that they are available to help determine whether an alarm in a corresponding portion of the $K_a$ band is an actual police radar signal or only a signal leaked from a LO of a nearby radar detector operating at a nominal 11.55 Ghz. Thus, no LO switching or other reconfigurations of the radar detector 100 circuitry need to be made to detect these potentially alert blocking signals.

Signals in the $K_a$ band within a range of frequencies that could be present due to leaked third harmonics of LO signals of a nearby radar detector are processed for possible suppression. Given a common used nominal LO frequency of 11.55 Ghz and allowing a range of typically 11.4 to 11.9 Ghz, the suspect range of frequencies deemed to be possible third harmonic spurious LO signals in a working embodiment of the radar detector 100 is then from about 34.2 Ghz to about 35.7 Ghz, see 190 in FIG. 5. If a detected $K_a$ band signal is not within the suspect range, the detected $K_a$ band signal is reported, see 192 in FIG. 5.

If a detected $K_a$ band signal is within the suspect range, a determination is made as to whether a potential alert blocking signal is present at the second harmonic frequency of the fundamental frequency which would generate the suspect $K_a$ band signal as its third harmonic, see 194 in FIG. 5. In the illustrated embodiment, the alert blocking signal which is checked has a frequency which is ⅔ the frequency of the detected $K_a$ signal plus or minus a guard band, for example the checked blocking signal may be ⅔ the detected $K_a$ signal ±40 Mhz, and is within a range of frequencies from about 22.813 Ghz to about 23.8 Ghz. If no blocking signal has been detected within about 10 seconds before or within three sweeps after detection of the $K_a$ band signal in the suspect range, the detected $K_a$ band signal is reported.

It is noted that other criteria can be used in the radar detector 100 for selecting the alert blocking signal or signals to be checked for suppressing nuisance alerts as well as the detection times for those blocking signals. For example, any signal within a range of frequencies corresponding to the second harmonic of nominal 11.55 Ghz signals, such as from about 22.813 Ghz to about 23.8 Ghz, could be used to block a corresponding block of $K_a$ band signals ranging, for example, from about 34.2 Ghz to about 35.7 Ghz. If a blocking signal is detected, the signal strength of the detected $K_a$ band signal is examined, see 196 in FIG. 5.

If the $K_a$ band signal strength is greater than a reporting threshold, for example around −92 dBm/cm$^2$, and also is greater than the signal strength of the blocking signal by a minimum threshold, for example around 10 dB, the detected $K_a$ band signal is reported. Otherwise the detected $K_a$ band signal is ignored, i.e., it is treated as a nuisance signal generated by a nearby radar detector and is suppressed, see 198 in FIG. 5. This arrangement is superior to other known implementations since it preserves the ability to report real $K_a$ band radar signals in the presence of third harmonic spurious emission from other radar detectors which may be operating nearby.

The radar detector 100 includes simplified and economical input stages 102, 104 which satisfy requirements for frequency preselection to improve the noise figure and sensitivity of the police radar detector 100. As previously noted, the input stages 102, 104 are substantially the same so that only the input stage 102 will be described herein. In the input stage 102 illustrated in FIG. 1, a preamplifier 110 is provided for coupling X band signals from the antenna 106 to the first mixer 108 with K and $K_a$ band signals being passively coupled from the antenna 106 to the first mixer 108.

Figure 3:
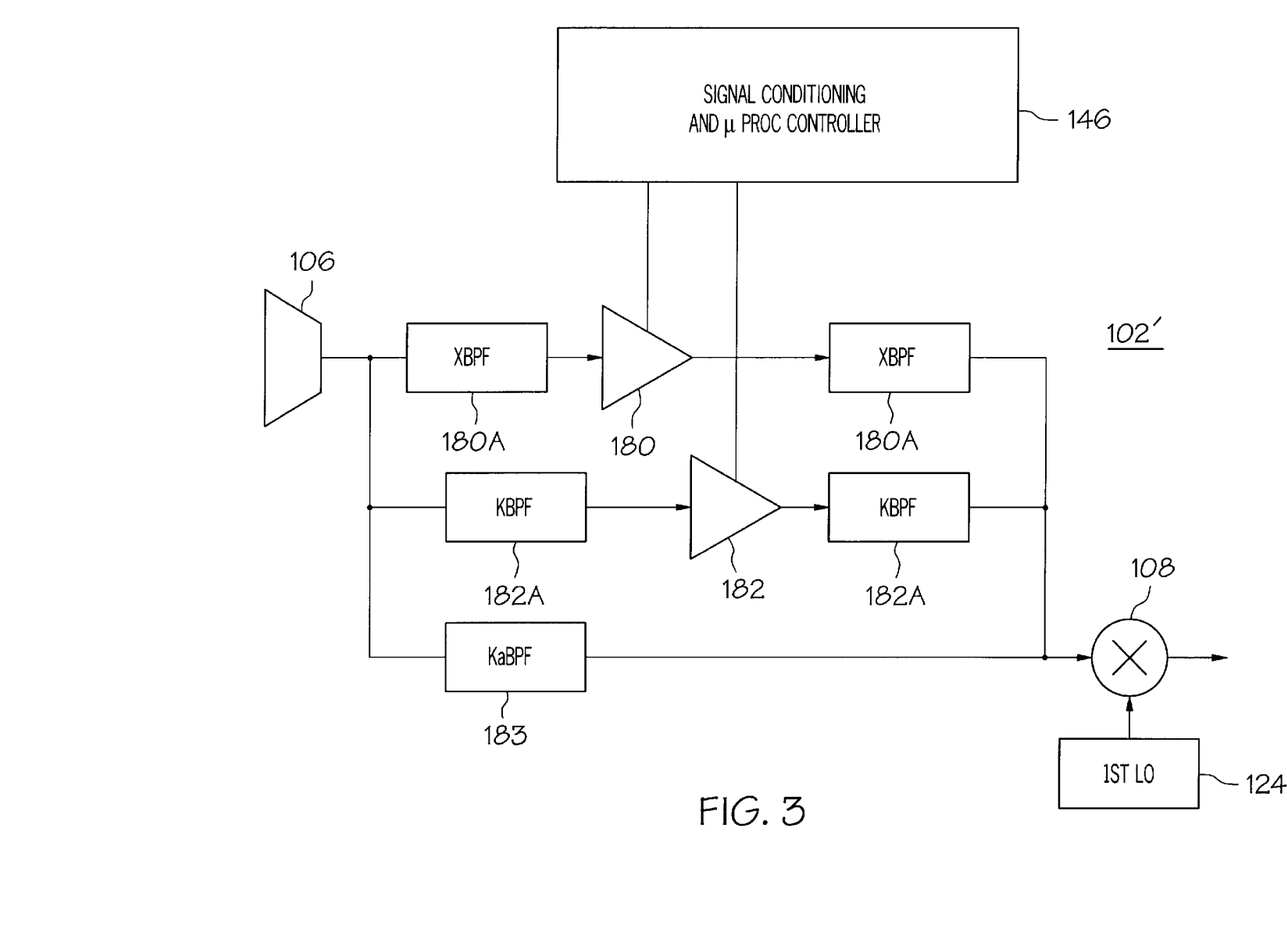
FIGS. 3 and 4 are schematic block diagrams illustrating alternate embodiments of input stages for the police radar detector of FIG. 1.
Figure 4:
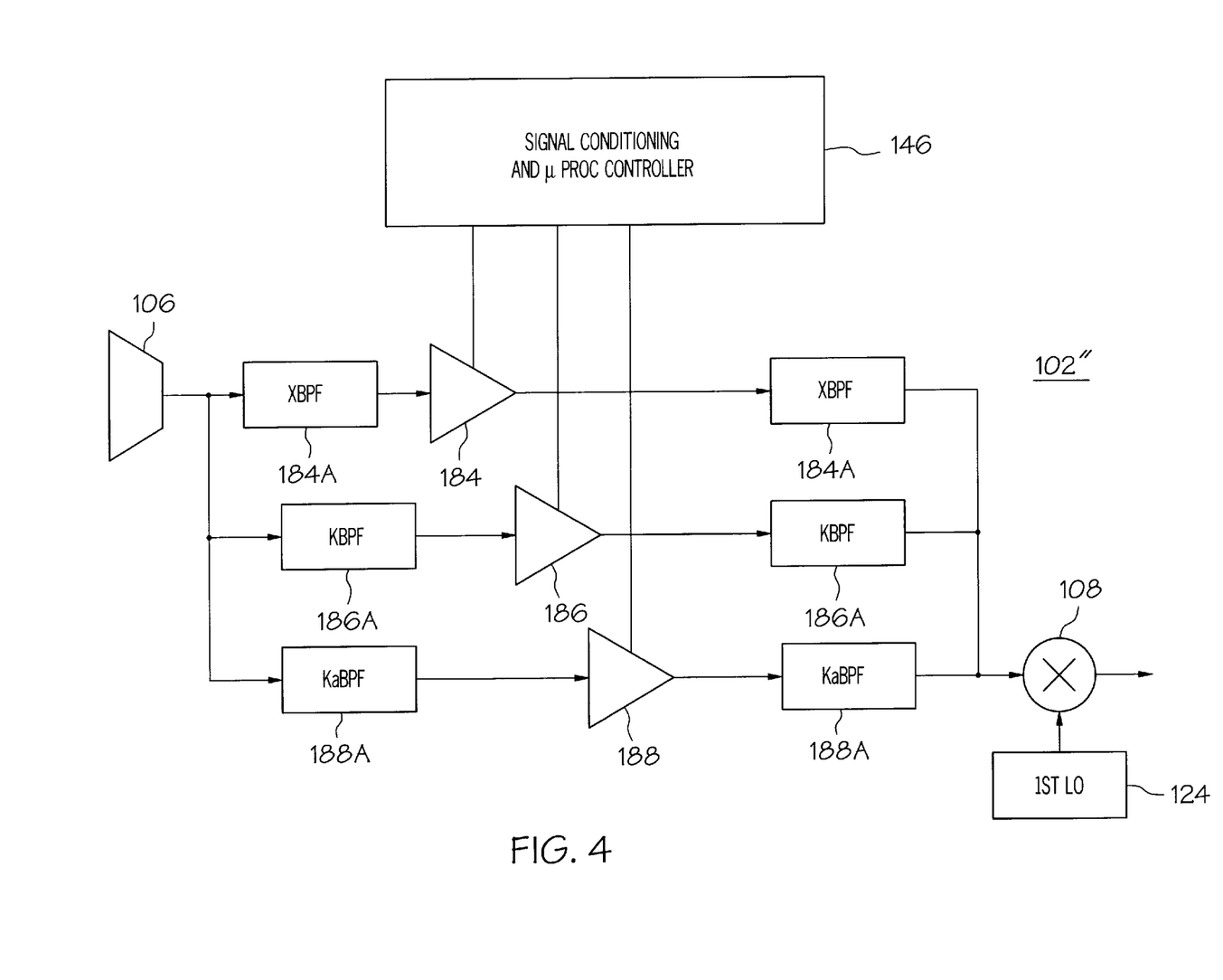

FIG. 3, wherein like elements are identified using the same reference numerals, illustrates a second embodiment of a single mixer input stage 102' that uses preamplifiers 180, 182 to couple X and K band signals, respectively, from the antenna 106 to the first mixer 108 for improved performance in those bands with $K_a$ band signals being passively coupled from the antenna 106 to the first mixer 108 for the sake of economy. X band bandpass filters 180A, K band bandpass filters 182A and a $K_a$ band bandpass filter 183 are also provided. FIG. 4, wherein like elements are identified using the same reference numerals, illustrates a third embodiment of a single mixer input stage 102" which provides preamplifiers 184, 186, 188 to couple all three police radar bands from the antenna 106 to the first mixer 108. X band bandpass filters 184A, K band bandpass filters 186A and $K_a$ band bandpass filters 188A are also provided. All three embodiments of the input stages of FIGS. 1, 3 and 4 utilize a single first mixer for economical handling of all three police radar bands.

In these embodiments, the preamplifiers are enabled one at a time as appropriate for scanning the corresponding bands. For the most improved noise figure, each preamplifier is designed with sufficient selectivity to reduce noise in its respective image bands to tolerable levels. The outputs of the preamplifiers are combined via passive frequency multiplexing performed by the bandpass filters 180A, 182A, 184A, 186A and 188A for input into a single mixer, the first mixer 108, for subsequent frequency conversion.

It is advantageous in radar detectors to receive multiple responses since the multiple responses frequently permit two or more radar bands, such as the K and $K_a$ bands or two frequencies within the very wide $K_a$ band, to be scanned simultaneously. As shown above, the frequency scheme for the radar detector 100 yields two responses approximately 1.3 Ghz apart that fall within the $K_a$ band if the $K_a$ band is coupled to the first mixer 108 passively or via a preamplifier having bandwidth sufficient to support both responses. The $K_a$ band signals thus coupled to the first mixer 108 can be swept by tuning the first LO 124 through a 1.3 Ghz range and the two responses cover the 2.6 Ghz required for sweeping the entire $K_a$ band. In comparison, if only a single response of the $K_a$ band was coupled to the mixer 108, the first LO 124 would have to tune the full 2.6 Ghz and the sweep time would double, assuming a fixed sweep rate.

However, when multiple responses are received and preamplifiers are used, the preamplifiers introduce noise at image frequencies thereby reducing the improvement in the noise figure which is attained by the preamplifiers. Thus, the input stages of FIGS. 3 and 4, better improve noise figure if they do not take advantage of scanning multiple responses; but, they consequently must devote more time to scanning since some or all of the receiver responses must now be swept independently.

It will be apparent to those skilled in the art that various combinations and alterations of preamplification are possible in accordance with this aspect of the radar detector 100. A particularly advantageous one of these is the result of a compromise between attaining lower noise figure and sweeping multiple responses. In particular, noise figure can be improved on the X and K bands by coupling these signals to the first mixer 108 using preamplifiers designed with sufficient selectivity to reduce noise in their respective image bands to tolerable levels while the $K_a$ band may be coupled to the first mixer 108 through a preamplifier which permits multiple responses to be swept in the $K_a$ band or passively for economy sake.

If the $K_a$ band preamplifier is sufficiently selective to prevent the passage of excess noise contributed by the K band response so that only the two noise paths for the $K_a$ band need be considered, a 3 dB penalty in noise figure arises from the dual responses. Blind adherence to the above described preamplification for the police radar bands would result in suppressing one of the $K_a$ band responses while somehow covering the 2.6 Ghz bandwidth of the $K_a$ band, thus attaining the 3 dB improvement. However, this arrangement would result in the loss of approximately 1.5 dB in the threshold sensitivity because the police radar detector is able to inspect the spectrum only half as often. Consequently, there would be a net improvement of only 1.5 dB accruing from all the effort expended to suppress the extra $K_a$ band receiver response. Worse, the same 1.5 dB loss in the threshold sensitivity would also be imposed on the X and K band sensitivity because of the nearly doubled sweep time entailed in covering all of the radar bands, the X band, the K band and the $K_a$ band.

Accordingly, a currently preferred embodiment of the radar detector 100 incorporates preselection to suppress the image noise in the X and K band preamplifiers but retains the receipt of dual responses in the $K_a$ band in spite of the 1.5 dB sensitivity penalty in the $K_a$ band. The sweep time of the preferred embodiment is only slightly longer than that required in a passive, multiple response design. This is because the $K_a$ band is 2.6 GHZ wide while the X and K bands are only 50 and 200 Mhz wide, respectively. Thus, the detector devotes the bulk of the sweep time to scanning the $K_a$ band and only a relatively modest increase in time is required to sweep the X and K band including frequency preselection.

Having thus described the invention of the present application in detail and by reference to preferred embodiments thereof, it will be apparent that modifications and variations are possible without departing from the scope of the invention defined in the appended claims.

What is claimed is:

1. An input stage for a police radar detector comprising:
   an antenna for receiving incoming electromagnetic signals;
   a local oscillator generating a local oscillator signal;
   a mixer having a near end and a far end, said local oscillator signal being coupled to said far end of said mixer;
   a preamplifier for amplifying low frequency signals and coupling amplified low frequency signals to said far end of said mixer;
   a diplexer connected to said antenna for directing high frequency signals to said near end of said mixer and for directing low frequency signals to said preamplifier;
   an intermediate frequency amplifier having an input coupled to said far side of said mixer; and switch circuitry coupled to said preamplifier and said far end of said mixer for switching said input stage between receipt of said high frequency signals and receipt of said low frequency signals.

2. An input stage for a police radar detector as claimed in claim 1 wherein said local oscillator is swept through a range of frequencies.

3. An input stage for a police radar detector as claimed in claim 2 wherein said local oscillator signal is swept through a range of frequencies from approximately 14.310 gigahertz to approximately 15.149 gigahertz.

4. An input stage for a police radar detector as claimed in claim 1 wherein said mixer comprises a pair of antiparallel diodes.

5. An input stage for a police radar detector as claimed in claim 4 wherein said switch circuitry couples an enable signal to said preamplifier and to said far end of said mixer.

6. An input stage for a police radar detector as claimed in claim 5 wherein said switch circuitry comprises a conductor for connecting said enable signal to said preamplifier and a resistor for coupling said enable signal to said far end of said mixer.

7. An input stage for a police radar detector as claimed in claim 1 wherein said diplexer comprises a frequency band rejection, filter connected between said antenna and said preamplifier.

8. An input stage for a police radar detector as claimed in claim 7 wherein said frequency band rejection filter rejects signals within a range of frequencies from approximately 24 gigahertz to approximately 36 gigahertz.

9. An input stage for a police radar detector as claimed in claim 1 further comprising a high pass filter connected between said antenna and said near end of said mixer wherein high frequency signals are directed through said high pass filter from said antenna to said near end of said mixer.

10. An input stage for a police radar detector as claimed in claim 9 further comprising a local oscillator bandpass filter connected between said local oscillator and said far end of said mixer wherein said local oscillator signal is coupled to said far end of said mixer through said local oscillator bandpass filter.

11. An input stage for a police radar detector as claimed in claim 10 further comprising a low pass filter connected between said preamplifier and said far side of said mixer to couple said preamplifier to said far end of said mixer.

12. An input stage for a police radar detector as claimed in claim 1 further comprising a low pass filter connected between said far end of said mixer and said intermediate frequency amplifier to couple said far end of said mixer to said input of said intermediate frequency amplifier.

13. An input stage for a police radar detector as claimed in claim 1 wherein said high frequency signals include at least the $K_a$ radar band and the K radar band, and the low frequency signals include at least the X radar band.

14. An input stage for a police radar detector comprising:
an antenna for receiving incoming electromagnetic signals;
a local oscillator generating a local oscillator signal which is swept through a range of frequencies;
a mixer having a near end and a far end;
a preamplifier for amplifying low frequency signals;
a diplexer connected to said antenna for directing high frequency signals to said near end of said mixer and for directing low frequency signals to said preamplifier;
an intermediate frequency amplifier having an input;
a passive multiplexer coupling said local oscillator to said far end of said mixer, coupling said preamplifier to said far end of said mixer and for coupling said far end of said mixer to said input of said intermediate frequency amplifier; and
switch circuitry coupled to said preamplifier and said far end of said mixer for switching said input stage between receipt of said high frequency signals and receipt of said low frequency signals.

15. An input stage for a police radar detector as claimed in claim 14 further comprising switch circuitry coupled to said preamplifier and said far end of said mixer for switching said input stage between receipt of said high frequency signals and receipt of said low frequency signals.

16. An input stage for a police radar detector as claimed in claim 15 wherein said passive multiplexer comprises a local oscillator bandpass filter for coupling said local oscillator to said far end of said mixer.

17. An input stage for a police radar detector as claimed in claim 14 wherein said passive multiplexer comprises a low frequency bandpass filter for coupling said preamplifier to said far end of said mixer.

18. An input stage for a police radar detector as claimed in claim 14 wherein said passive multiplexer comprises a low pass filter for coupling said far end of said mixer to said input of said intermediate frequency amplifier.

19. An input stage for a police radar detector comprising:
an antenna for receiving incoming electromagnetic signals;
a local oscillator generating a local oscillator signal;
a mixer having a near end and a far end, said local oscillator signal being coupled to said far end of said mixer;
a preamplifier for amplifying low frequency signals and coupling amplified low frequency signals to said far end of said mixer;
a diplexer connected to said antenna for rejecting high frequency signals and for directing low frequency signals to said preamplifier;
a high pass filter connected to said antenna for directing high frequency signals to said near end of said mixer;
an intermediate frequency amplifier having an input coupled to said far side of said mixer; and
switch circuitry coupled to said preamplifier and said far end of said mixer for switching said input stage between receipt of said high frequency signals and receipt of said low frequency signals.

20. An input stage for a police radar detector as claimed in claim 19 wherein said local oscillator is swept through a range of frequencies.

* * * * *

UNITED STATES PATENT AND TRADEMARK OFFICE
CERTIFICATE OF CORRECTION

PATENT NO : 5,856,801

DATED : January 5, 1999

INVENTOR(S) : Michael David Valentine; Clarence Richard Groth; and Stephen Ray Scholl It is certified that error appears in the above-identified patent and that said Letters Patent is hereby corrected as shown below:

Col. 13, line 24, "rejection, filter . . ." should be - - rejection filter . . . - - .

Signed and Sealed this

Eighth Day of June, 1999

Q. TODD DICKINSON

*Attest:*

*Attesting Officer*      *Acting Commissioner of Patents and Trademarks*